US007834719B2

(12) United States Patent
Cheung et al.

(10) Patent No.: US 7,834,719 B2
(45) Date of Patent: Nov. 16, 2010

(54) LANGE-FERRITE CIRCULATOR FOR SIMULTANEOUS TRANSMIT AND RECEIVE (STAR) WITH HIGH ISOLATION AND NOISE SUPPRESSION

(75) Inventors: Siu K. Cheung, Storrs, CT (US); William H. Weedon, III, Warwick, RI (US)

(73) Assignee: Applied Radar Inc, North Kingstown, RI (US)

( * ) Notice: Subject to any disclaimer, the term of this patent is extended or adjusted under 35 U.S.C. 154(b) by 60 days.

(21) Appl. No.: 12/475,196

(22) Filed: May 29, 2009

(65) Prior Publication Data

US 2009/0296790 A1 Dec. 3, 2009

Related U.S. Application Data

(60) Provisional application No. 61/057,831, filed on May 31, 2008.

(51) Int. Cl.
*H03H 11/02* (2006.01)

(52) U.S. Cl. .................................... 333/117; 333/24 R

(58) Field of Classification Search .................. 333/1.1, 333/24.2, 24.3, 117, 100, 132, 134, 24 R; 455/137, 139, 106, 82

See application file for complete search history.

(56) References Cited

U.S. PATENT DOCUMENTS 6,313,713 B1 * 11/2001 Ho et al. ...................... 333/1.1
2009/0108954 A1 * 4/2009 Cheung et al. ............... 333/1.1

* cited by examiner

*Primary Examiner*—Stephen E Jones
(74) *Attorney, Agent, or Firm*—Maurice M. Lynch

(57) ABSTRACT

A three port circulator capable of simultaneous transmit and receive operations, high frequency, enhanced high isolation, noise suppression at the receive port and broadband performance comprising: an antenna port; a transmission port; a receiving port; wherein each port is connected to a 90 degree combiner/divider or a quadrature hybrid for splitting an input signal into two output components, the said output components have a ninety degrees relative phase difference to each other; each of said 90 degree combiners/dividers or quadrature hybrids in addition to the connection to the above mentioned ports has at least two output connections each of which are connected to a ferrite circulator and if a fourth connection, said fourth connection is attached to a matching load circuit; this arrangement of circuits allows the phase shifted signals from the transmit port to enter the 90 degree combiner/divider or quadrature hybrid and be recombined in phase at the antenna port, any residue signal due to impedance mismatch at the antenna port and/or the isolation or imperfect suppression of mode degeneracy of the ferrite circulator at the Y-junction will get to the 90 degree combiner/divider or quadrature hybrid at the receive port and is phased cancelled; said arrangement simultaneously allows the receive signal entering the antenna port and proceeding to the 90 degree combiner/divider or quadrature hybrid at the antenna port and to be combined in phase by the 90 degree combiner/divider or quadrature hybrid at the receive port.

8 Claims, 7 Drawing Sheets

LANGE-FERRITE CIRCULATOR FOR SIMULTANEOUS TRANSMIT AND RECEIVE (STAR) WITH HIGH ISOLATION AND NOISE SUPPRESSION

CROSS-REFERENCE TO RELATED APPLICATIONS

Radar Systems.

FEDERALLY SPONSORED RESEARCH

None.

SEQUENCE LISTING

None.

REFERENCES CITED

US Patent Documents: Publication Number US-200900108954-A1

Other Publications: None.

Priority Document: non-provisional application No. 61/057,831 filed May 31, 2008

FIELD OF INVENTION

The invention related to methods of constructing circulators with high isolation and noise suppression at receive port or channel for broadband and simultaneous transmit and receive (STAR) radar systems and communication applications.

BACKGROUND INFORMATION

The development of broadband, high-isolation, and noise suppression circulators with simultaneous transmit and receive (STAR) capabilities would enable multi function and multi-task operations for radar systems with multi functional communication applications. The commercial applications is to promote the development of innovative broadband products and services with simultaneous transmit and receive capabilities for next-wave of multi-tasking industrial products in the areas of ultra-high-speed wireless data communications and broadband internet access. Moreover, these STAR features of the active circulator allow subassembly MMIC integrations with possible circuit reductions and reuse from circuitry redundancy which may result in cost savings from system architect viewpoint. The inventors have experience with a Lange-type or quadrature hybrid quasi-active circulator capable of high isolation application and reducing noise through phase separation and interference techniques. They propose to improve upon this by constructing subsystem by combining the quadrature hybrid structure with ferrite circulators to further enhance isolation and suppress noise at the receive port from the transmit port. The quadrature hybrid structure can be implemented by Lange couplers. The improvements are for both the active circulators and subsystems using typical ferrite circulators or other symmetrical/unilateral circuits placed at the Y-junctions. For the active circulator, the improvement is lower insertion losses for both the transmit to antenna path and the antenna to receive path. For subsystems using typical ferrite circulators, the improvements are enhancement of isolation between the transmit and receive port and noise suppression at the receive port from the transmit port, due to the phase cancellation of a 3-Lange architecture in additional to the isolation of the ferrite circulator. Refer to US Patent Document: Publication Number US-20098954-A1.

SUMMARY OF THE INVENTION

It is an object of this invention to build a circulator, either active or passive, to achieve very high isolation with acceptable bandwidth and noise suppression from the Tx channel to the Rx channel for STAR operation.

It is an object of this invention to improve upon the performances of passive ferrite circulators and passive electronic circulators by combining these circulators with the 3-Lange structure using phase-cancellation technique that showed high isolation and noise suppression performance at the receive channel.

It is a further object of this invention to create such a circulator described above that can be incorporated on a semiconductor chip.

This invention is the realization that the objective of a Lange-ferrite or electric circulator with high isolation, noise suppression at the receive port and low insertion losses for both from the antenna to the receive port and from the transmit to antenna port that can be achieved by using two ferrite or electric circulators in the place of the inner Y-junctions in a 3-Lange MMIC structure using phase cancellation and phase combination techniques.

It is a further object of this invention to create a 3-Lange architecture that includes ferrite circulators to further enhance the isolation performance and noise suppression at the receive port from the transmit port of the so-called Lange-ferrite circulators;

In general, this circulator is comprised of a three port 3-Lange structure, described in US Patent Document: Publication Number US-2009-0108954-A1. In this application the Y-junctions of the 3-Lange structure are replaced with ferrite circulators.

BRIEF DESCRIPTION OF THE DRAWINGS

Figure one is a prior art rendition of a 3-Lange circulator.

Figure two is a rendition of the proposed invention with Lange couplers and ferrite circulators substituted for the Y-junctions.

Figure three is a rendition of the invention of the various forms of ferrite circulators that can be used with this device.

Figure four is a depiction of the device representing a general configuration using the 90 degree combiners/dividers or quadrature hybrids and ferrite circulators in the construction of the device.

Figure five is a graphical representation showing the measured performance of a typical broadband ferrite circulator at X-band.

Figure 5:
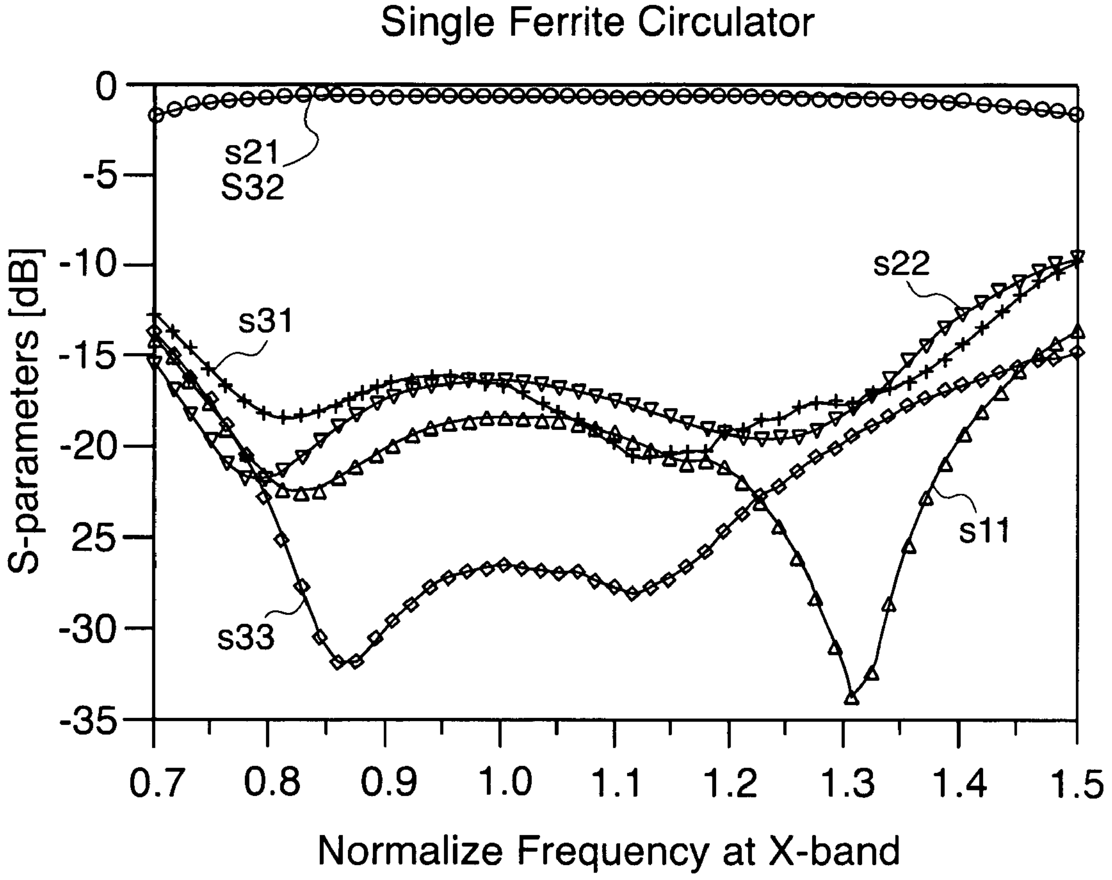

Figure six is a graphical representation showing the measured performance of a Lange-ferrite circulator using the broadband ferrite circulator with performance shown in FIG. 5, at X-band. S31 is the isolation between the transmit port and receive port.

Figure seven compares the noise figure performances of a ferrite circulator, a 3-ferrite circulator and a Lange-ferrite circulator, at X-band.

DETAILED DESCRIPTION OF THE PREFERRED EMBODIMENT

Figure one is a prior art rendition of the basic design of a 3-hybrid circulator with a transmit port 1, antenna port 2, and receive port 3. Each port is connected to a 90 degree combiner/divider or quadrature hybrid, 4T, 4A, and 4R. Balancing the input to the 90 degree combiner/divider is a matching load circuit, 5. Each combiner/divider is connected to two Y-junctions A, 7, and B, 8. The arrangement of the three quadrature hybrids is in such a way that part of the transmit signal entering the transmit port will be recombined constructively in phase at the Antenna port while the rest of the transmit signal will be recombined destructively in phase at the receive port for isolation between the transmit port and the receive port. Simultaneously, the receiving signal at the antenna port will be recombined constructively in phase at the receive port.

Figure two depicts the basic building block of the device contains three Lange couplers and two sets of typical ferrite circulators, C1 and C2. The 3L-Lange circulator has shown high isolation performance due to phase combination and cancellation. The isolation of the ferrite circulator is generally contributed by impedance mismatch and suppression of mode degeneracy. In additional to the inherent isolation of ferrite circulator, the isolation of the 3-Lange arrangement allows the ferrite circuit to further enhance the isolation between the Tx port, 1, and Rx port, 3, reduce the insertion loss from both the Tx port, 1, to the Ant port, 2, and the Ant port, 2, to the Rx port, 3, when compared to typical performance of a 3-Lange circulator, and suppress noise at the Rx port, 3, from the transmit port, if the device is connected with an external PA at the transmit port. The ferrite circulator can be implemented in form of single ferrite, two-ferrite or three-ferrite configurations or other electrical circulators with low insertion loss.

For transmit mode operation, the transmit input signal is split into quadrature signal with equal magnitude by the Lange coupler, 4T, at the Tx port. The split quadrature signal is then circulated to the antenna port by the ferrite circulators where it is recombined constructively in phase by a second Lange coupler, 4A, at the Antenna port. There is a small amount of the split transmit signal, either due to reflection at the antenna, port, 2, or leakage of the ferrite circulators, C1 and C2, circulating to the receive port, 3, where it is further attenuated due to phase cancellation imposed by the third Lange coupler, 4R, at the receive port. The isolation at the receive port is therefore enhanced between the transmit port and the receive port due to the imposed isolation of the 3-Lange structure based on phase interference in additional to the inherent isolation of the ferrite circulators.

For receive mode operation, the receive signal at the antenna port, 2, has similar operation as the transmit port except that the split receive signal from the antenna is now recombined constructively in phase at the receive port, while the reverse transmission between the antenna port and the transmit port is isolated by the ferrite circulators.

The reverse transmission from the receive port to the transmit port has operation similar to the said transmit mode except that the reverse transmission from the receive port to the antenna port is isolated by the ferrite circulators.

For devices implemented with the basic block configuration of the Lange-ferrite circulator shows a true circulating operation.

Figure three is a rendition of the various forms of ferrite circulator combinations that may be used with this device. The inset of the ferrite circulator shows that the ferrite circulator can be implemented in forms as shown in Configurations 1-3. Configuration 1 is a circulator using a single ferrite device. Configuration 2 is a circulator that includes two ferrite devices consisting of a ferrite isolator and ferrite circulator. Configuration 3 is a 3-ferrite circulator that consists of two ferrite isolators and one ferrite circulator.

Figure 1:
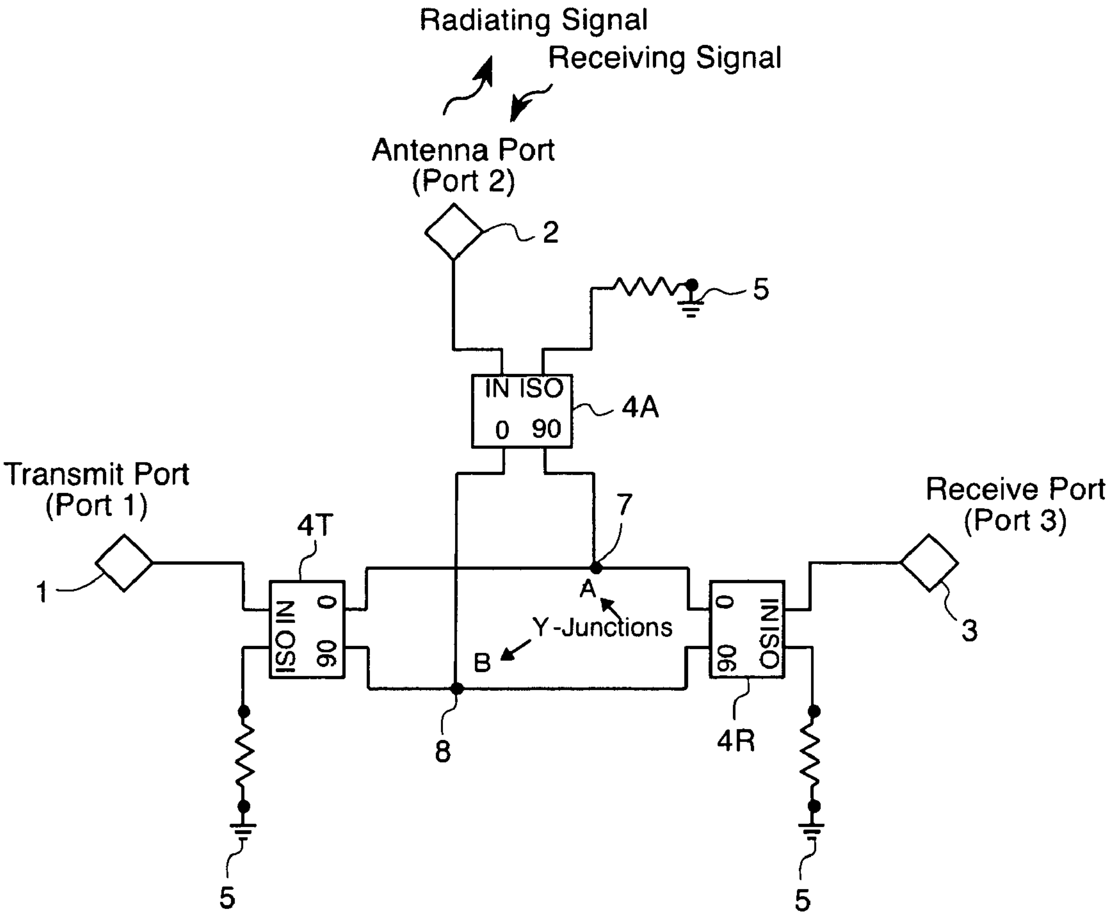
FIG. 1 (PRIOR ART)
Figure 2:
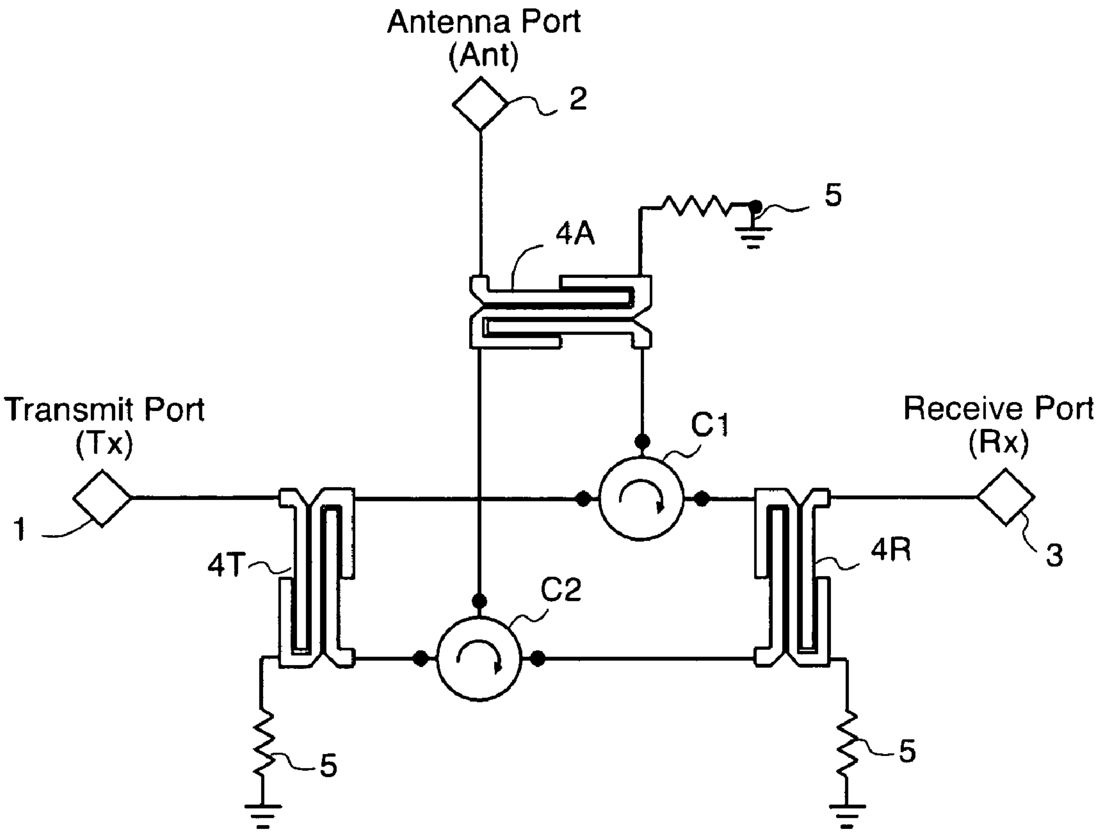
Figure 3:
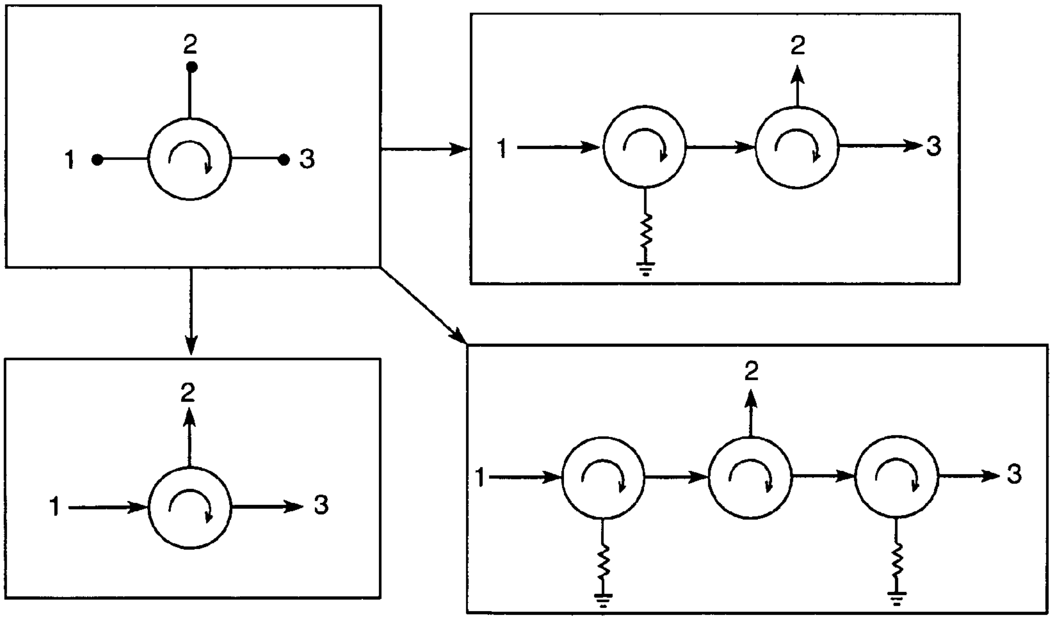
Figure 4:
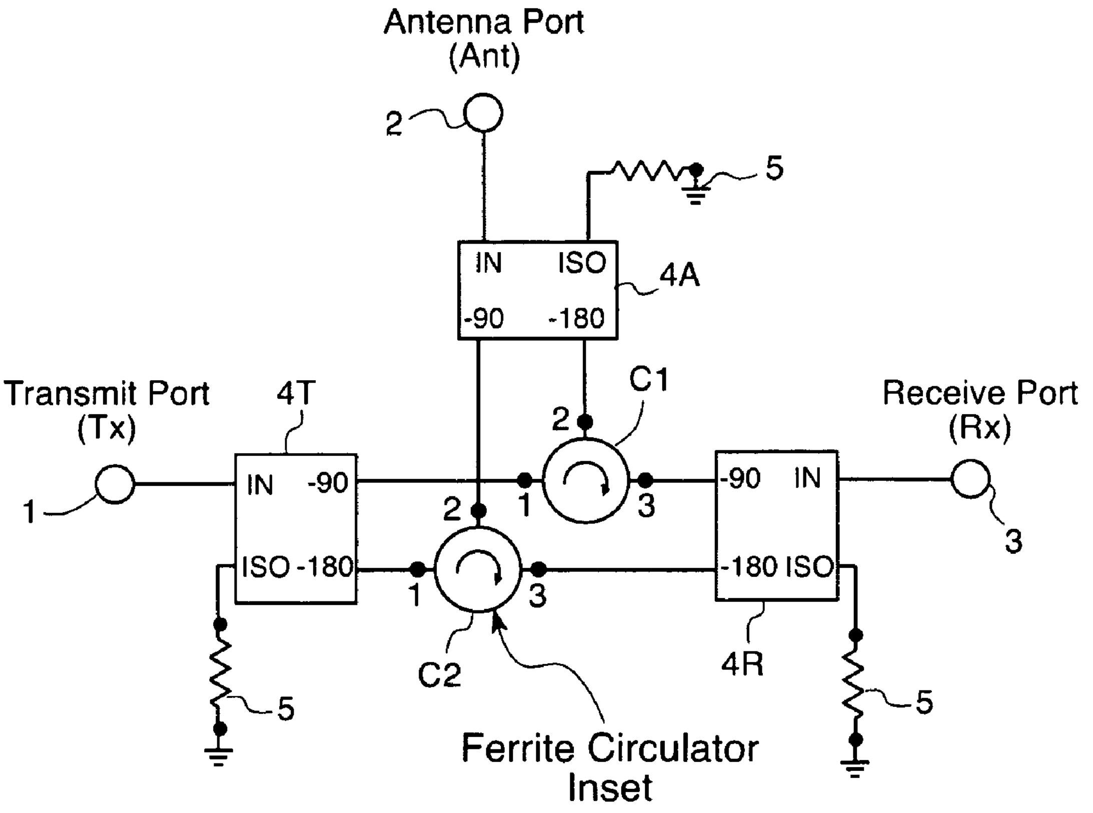

Figure four is a rendition of the device with a general form of the 90 degree combiners/dividers or quadrature hybrids. In general, the Lange couplers can be replaced by any quadrature hybrids that can be implemented either using passive or active circuits. The inset of the ferrite circulator is shown in FIG. 3. In addition, the ferrite circulators can be any electrical circulators with low insertion loss.

Figure five is a graphical representation showing the normalized measurement data of a typical broadband ferrite circulator at X-band. S21 is the transmission from transmit to receive port. S32 is the transmission from Antenna to receive port. S31 is the isolation or forward transmission between the transmit port and the receive port. S11, S22 and S33 are the return losses of the transmit port, antenna port, and receive port, respectively. The isolation of the ferrite circulator has a 60% bandwidth with 15 dB isolation at X-band.

Figure 6:
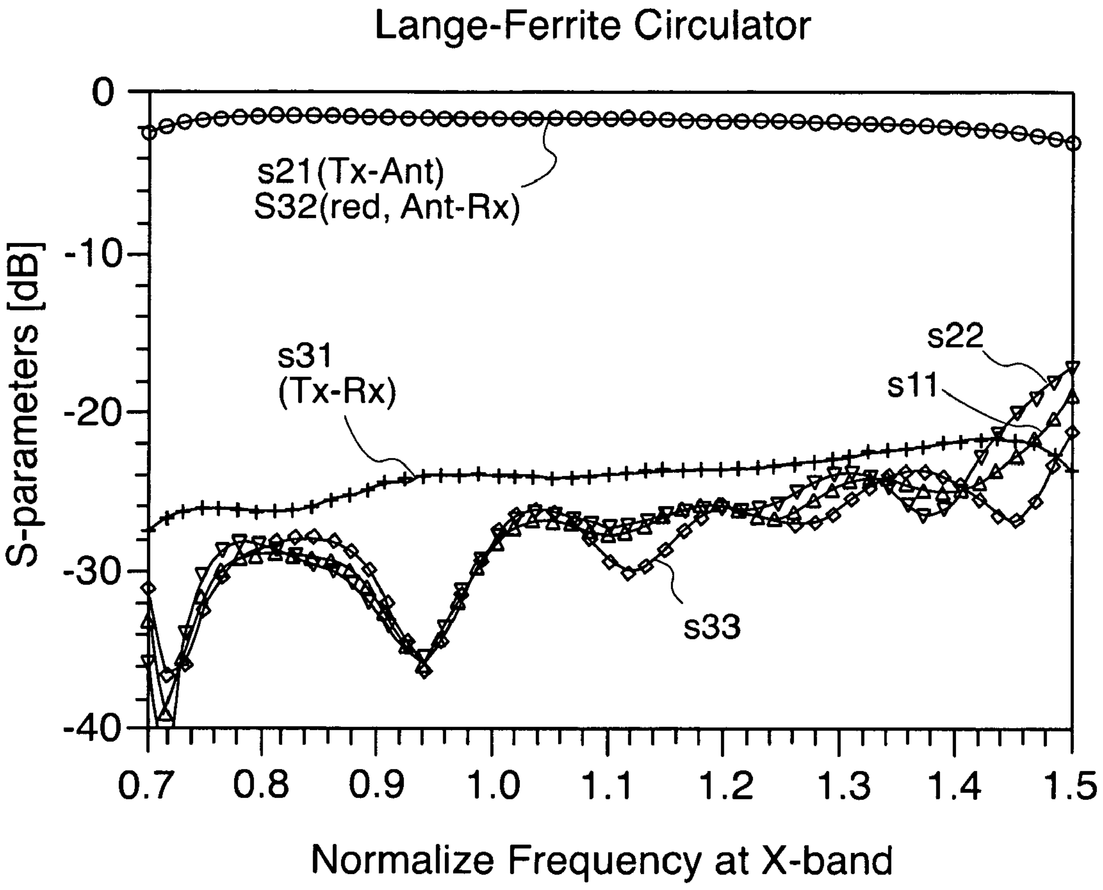
Figure 7:
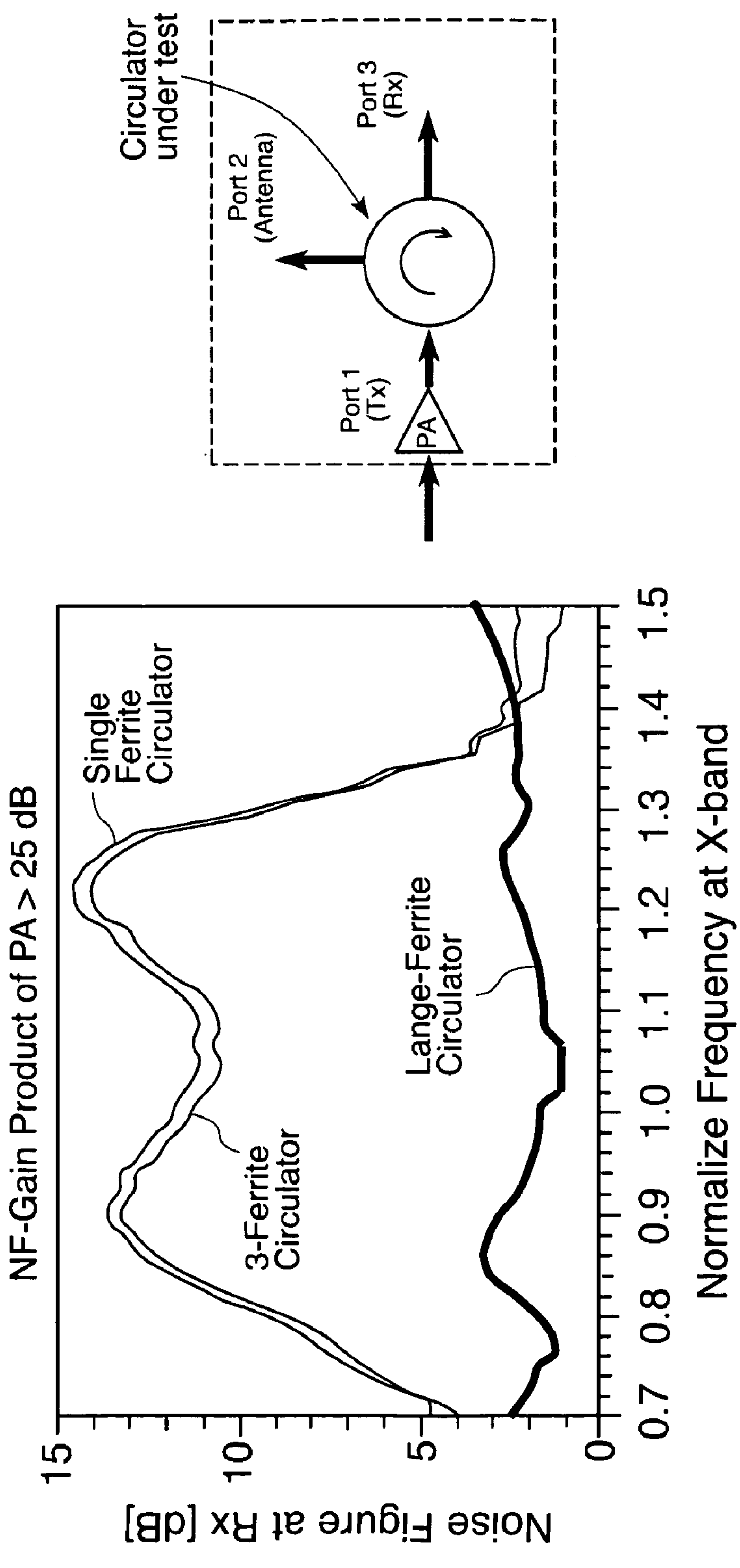

Figure six is a graphical representation showing the normalized result of the simulated performance of a Lange-ferrite circulator at X-band using the measured data of the broadband ferrite circulator as shown in FIG. 5. S21 is the transmission from transmit to antenna port. S32 is the transmission from Antenna to receive port, S31 is the isolation from the transmit to receive port. S11, S22, and S33 are the return losses of the transmit port, antenna port, and receive port, respectively. The isolation of the Lange-ferrite circulator without tuning or optimization has a >80% bandwidth with 22 dB isolation at X-band. By comparing the results of FIG. 5 and FIG. 6, the Lange-Ferrite circulator shows an enhancement of isolation performance with wider bandwidth.

Figure seven compares the simulated noise figure (NF) performances at the receive port among a single-ferrite circulator, a 3-ferrite circulator and a Lange-ferrite circulator, using an external power amplifier (PA) at the transmit port for STAR operation. All the circulators structures use the same measured data of the ferrite circulator as shown in FIG. 5. To simulate the NF performance at the receive port or channel for STAR operation, the transmit port of the circulators are connected to an external PA with Gain-NF product ~27 dB. The Lange-ferrite circulator shows that a NF performance at the receive port is less than 3.5 dB across the whole band (80%), while the single-ferrite and 3-ferrite circulators have their NF performances well above 10 dB. The data show that the Lange-ferrite circulator has superior noise suppression or lower NF at the receive port. The figure on the right is the test setup.

What is claimed is:

1. A three port circulator capable of simultaneous transmit and receive operations, high frequency, enhanced high isolation, noise suppression at the receive port and broadband performance comprising:

an antenna port;

a transmission port;

a receiving port;

wherein each port is connected to a 90 degree combiner/divider or a quadrature hybrid for splitting an input signal into two output components, the said output components have a ninety degrees relative phase difference to each other;

each of said 90 degree combiners/dividers or quadrature hybrids in addition to the connection to the above mentioned ports has at least two output connections each of which are connected to a ferrite circulator and if a fourth connection, said fourth connection is attached to a matching load circuit;

this arrangement of circuits allows the phase shifted signals from the transmit port to enter the 90 degree combiner/ divider or quadrature hybrid and be recombined in phase at the antenna port, any residue signal due to impedance mismatch at the antenna port and/or the isolation or imperfect suppression of mode degeneracy of the ferrite circulator at the Y-junction will get to the 90 degree combiner/divider or quadrature hybrid at the receive port and is phased cancelled;

said arrangement simultaneously allows the receive signal entering the antenna port and proceeding to the 90 degree combiner/divider or quadrature hybrid at the antenna port and to be combined in phase by the 90 degree combiner/divider or quadrature hybrid at the receive port.

2. A circulator as described in claim one, wherein the 90 degree divider/combiner or quadrature hybrid can be implemented by a Lange coupler.

3. A circulator as described in claim one, wherein each of said ferrite circulators is comprised of one ferrite circulator.

4. A circulator as described in claim one, wherein each of said ferrite circulator is comprised of two ferrite circulators in series where the front ferrite device of the two ferrite circulators in series acts as an isolator to enhance isolation and reduce noise from the transmit port to the receive port in the device.

5. A circulator as described in claim one, wherein each of said ferrite circulator is comprised of three ferrite circulators in series where the two ferrite circulators at the ends of the series act as isolators to further enhance isolation and reduce noise from the transmit port to the receive port in the device.

6. A circulator as described in claim one, wherein the 90 degree dividers/combiners or quadrature hybrids can be implemented by electric circuits with quadrature output.

7. A circulator described in claim one wherein both the 90 degree combiners/dividers or quadrature hybrids and the ferrite circulators can be implemented by active circuits.

8. A circulator described in claim one wherein both the 90 degree combiners/dividers or quadrature hybrids and the ferrite circulators can be realized using MMIC if they are implemented by active circuits.

* * * * *